(12) United States Patent
Doty (10) Patent No.: US 6,198,284 B1
(45) Date of Patent: Mar. 6, 2001

(54) HIGH POWER FLEXIBLE LEADS FOR DAS NMR

(75) Inventor: F. David Doty, Columbia, SC (US)

(73) Assignee: Doty Scientific Inc., Columbia, SC (US)

( * ) Notice: Subject to any disclaimer, the term of this patent is extended or adjusted under 35 U.S.C. 154(b) by 0 days.

(21) Appl. No.: 09/059,544

(22) Filed: Apr. 13, 1998

Related U.S. Application Data (60) Provisional application No. 60/043,629, filed on Apr. 14, 1997.

(51) Int. Cl.$^7$ .................................................. G01V 3/00
(52) U.S. Cl. ........................... 324/318; 324/322; 324/300
(58) Field of Search ........................................ 324/318, 322, 324/321, 300

(56) References Cited

U.S. PATENT DOCUMENTS

| | | | |
|---|---|---|---|
| 4,968,938 | 11/1990 | Pines | 324/321 |
| 5,154,625 | 10/1992 | Borokowski | 439/161 |
| 5,424,645 | 6/1995 | Doty | 324/318 |
| 5,508,615 | 4/1996 | Doty | 324/321 |

OTHER PUBLICATIONS

S. Ganapathy, S. Schramm, and E. Oldfield, "Variable–Angle Sample Spinning High Resolution NMR of Solids," *J. Chem. Phys.*, vol. 77, No. 9, pp. 4360–4365, 1982.

Ad Bax, N. M. Szeverenyi, and G. E. Maciel, "Chemical Shift Anisotropy in Powdered Solids Studied by 2D FT NMR with Flipping of the Spinning Axis," *J. Magn. Reson.*, vol. 55, pp. 494–497, 1983.

T. Terao, T. Fujii, T. Onodera, and A. Saika, "Switching–Angle Sample–Spinning NMR Spectroscopy for Obtaining Powder–Pattern–Resolved 2D Spectra: Measurements of $^{13}C$ Chemical–Shift Anisotropies in Powdered 3, 4–Dimethoxybenzaldehyde," *Chem. Phys. Lett. 107*, No. 2, pp. 145–148, 1984.

(List continued on next page.)

*Primary Examiner*—Christine K. Oda
*Assistant Examiner*—Brij B. Shrivastav
(74) *Attorney, Agent, or Firm*—Oppedahl & Larson LLP (57) ABSTRACT

A flexible, low-loss, low-capacitance, high-voltage, high-current, moderate-impedance, unshielded, balanced, rf-pulse transmission twinline is produced by etching parallel copper traces on opposite sides of a flexible substrate, spaced apart such that the distance between the conductors is greater than four times the substrate thickness and at least one of the conductors has a width greater than half of the separation between the conductors. A second, similar twinline may be etched on the same substrate beside the first twinline and paralleled at both ends with the first twinline to form a lower-impedance quadline such that alternate conductors in the quadline are on alternate sides of the substrate and have opposite current phases. Both surfaces may be coated with a thin, flexible dielectric to increase the voltage rating for a given conductor separation with minimal affect on propagation factor, attenuation constant, or flexibility. A second, similar quadline on a separate laminate displaced along the normal from the first may be paralleled with the first quadline forming a lower-impedance dual-quadline such that the two laminates have mean spacing comparable to or greater than the spacing between conductors within a twinline. The two quadlines are paralleled such that the phases in the conductors in one quadline are the same as the phases in the adjacent conductors in the adjacent quadline. The concepts may be extended in like manner for further reduction in characteristic impedance without sacrifice in propagation factor, attenuation constant, or flexibility.

25 Claims, 6 Drawing Sheets

OTHER PUBLICATIONS

K. T. Mueller, B. Q. Sun, G. C. Chingas, J. W. Zwanziger, T. Terao, and A. Pines, "Dynamic–Angle Spinning of Quadrupolar Nuclei," *J. Magn. Reson.*, vol. 86, pp. 470–487, 1990.

F. D. Doty, "Probe Design and Construction," *Encyclopedia of NMR*, vol. 6, Wiley Press, 1996.

F. D. Doty, "Solid State Probe Design," *Encyclopedia of NMR*, vol. 7, Wiley Press, 1996.

HIGH POWER FLEXIBLE LEADS FOR DAS NMR

RELATED APPLICATIONS

This application claims priority from pending U.S. Provisional Application Serial No. 60/043,629 filed on Apr. 14, 1997, which is hereby incorporated by reference.

FIELD OF THE INVENTION

The field of this invention is the measurement of nuclear magnetic resonance (NMR) for the purpose of determining molecular or microscopic structure, and, more particularly, a novel lead arrangement for minimizing signal losses where repeated reorientation of the sample spinning axis is required, especially with quadrupolar solids.

BACKGROUND OF THE INVENTION

For the past three decades, there have been numerous applications for single, double, and triple resonance circuits in NMR of solid samples where high rf magnetic field strength $B_1$ at high field $B_0$ is required with minimal signal loss for high sensitivity. In U.S. Pat. No. 4,968,938, Pines and Samoson disclose a technique, Dynamic Angle Spinning (DAS), for improving resolution in quadrupolar solids. The DAS technique requires rapid reorientation of the axis of a rapidly spinning sample. Variable Angle Spinning (VAS) probes have been commercially available since 1983 for related techniques for quadrupolar nuclides as described by Oldfield. Other techniques requiring rapid reorientation of the spinning axis (Switched Angle Spinning, SAS) were described in 1984 by Terao and others. More recently, VAS and SAS techniques have been shown to be quite useful in biological membranes, especially where both the wideline spectra with the tissue oriented at 90° with respect to $B_0$ and the High Resolution Magic Angle Spinning (HR-MAS) spectra are needed to determine the structure. However, because of the technical difficulties involved in producing a multinuclear SAS or DAS probe capable of high $B_1$ and $B_2$ (and possibly $B_3$) with high sensitivity, only a handful of such probes have been produced, even though numerous applications have been identified for at least fifteen years.

For experiments on solid samples at high $B_0$, typical voltages across the solenoidal sample coil are 2 to 6 kV. Broadband (multinuclear) triple-resonance circuits as disclosed by Doty in U.S. Pat. No. 5,424,645 have provided multinuclear tuning capability on a Low-Frequency (LF) and Mid-Frequency (MF) channel with high-power $^1H$ decoupling for various NMR experiments such as REDOR and double CP. Normally, a sample spinner similar to the one described by Doty et al in U.S. Pat. No. 5,508,615 (note the extensive list of typographical corrections) is utilized, as it has the symmetry needed to permit rapid reorientation. Some of the probe requirements are reviewed briefly by Doty in 'Solid State NMR Probe Design', *The NMR Encyclopedia*, Vol. 6, Wiley Press, 1996. Several copending applications describe methods of improving resolution and decoupling efficiency in HR-MAS.

For the past five decades, NMR probes for solid samples have almost exclusively utilized solenoidal sample coils, although fixed-tuned transverse coils for the high frequency (HF) in combination with solenoids for the LF are shown in a copending application to offer advantages in many CPMAS applications. In this case, the HF coil may be approximately tuned by fixed capacitors within a few millimeters of the coil to the desired HF, and the voltage standing wave ratio (VSWR, defined in terms of the reflection coefficient in the usual manner) on the balanced transmission line driving the HF coil may be as low as 10 to 40 for a characteristic HF line impedance of about 120 Ω and still achieve adequate tuning range. Peak differential HF voltages are normally under 1.4 kV for this low-inductance coil arrangement. The LF/MF solenoid, on the other hand, cannot be broad-banded and/or double tuned without VSWR's typically in the range of 100 to 500 for a balanced LF transmission line impedance of about 50 Ω. Peak differential LF/MF coil voltages are usually in the range of 2.2 to 5 kV, and pulsed rf currents are typically around 50 amps.

Clearly, one of the most difficult technical problems has been the flexible, high-power rf leads, where conventional tranmission-line analysis is of limited utility because of the high VSWR. A variety of approaches have been tried, but all have been unsatisfactory from a practical and performance perspective for multinuclear applications. Sliding contacts from a variety of materials, arranged in an arc either beside or below the spinner assembly, may allow reduced variation in lead capacitance as the angle is changed, but the mechanism's capacitance and contact resistance make this approach quite unsatisfactory, as one might well imagine with UHF VA products well over $10^5$ VA. The least satisfactory prior art from an rf performance perspective used 'watch-spring' leads to permit millions of flips without fatiguing. Most prior art utilized several parallel leads of flattened silver-plated fine copper braid without polymeric insulation. The leads then must be well spaced to prevent arcing as their relative positions change throughout sample reorientation. The primary problem with this approach is that the nominal characteristic impedance of the leads must be high (typically over 220 Ω) to insure adequate separation, and the braid usually fatigues after fewer than a thousand flips. Moreover, the attenuation constant is generally greater than 0.15 dB/m at 200 MHz, and the high characteristic impedance results in increased voltage transformation, VSWR, and losses.

Lightly twisted stranded wires of several hundred strands of #40 AWG silver-plated copper wire will perform satisfactorily for perhaps a thousand flips near room temperature if insulated with polypropylene or teflon foam about 0.5 to 1.5 mm thick, as the wires may be bundled together using a teflon string wrap to produce a balanced transmission line of sufficiently low characteristic impedance (under 120 Ω), high voltage (HV) rating above 2.2 kV, high propagation velocity factor (preferably greater than 85%), and low attenuation constant (under 0.1 dB/m at 200 MHz). The ultra low attenuation constant is needed even with short leads because the signal loss is multiplied by the VSWR. The primary disadvantage of this approach is the limited lifetime, owing to fatiguing of strands within the bundles. Moreover, because of the thickness of the insulation, it is too brittle below about −50° C., and operation is frequently needed from −140° C. to +200° C.

Figure 1:
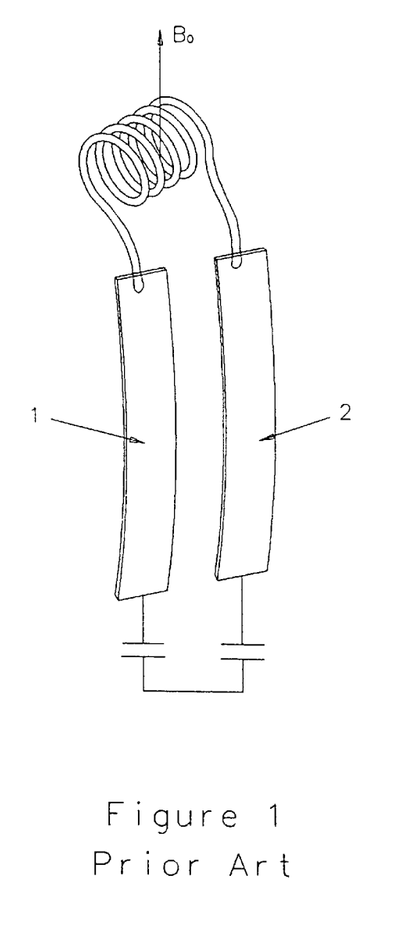
FIG. 1 illustrates flexible laminate leads according to the prior art.

Another prior art technique utilized two separate, parallel strips of thin polyimide film (such as Kapton or Regulus) about 0.05 mm thick with copper cladding about 0.06 mm thick on one side. The strips, each 5 to 10 mm wide, were attached separately to the rf sample coil terminations and spaced 10 to 20 mm apart to prevent shorting as they flexed during changes in the spinner angle, as shown in FIG. 1. Annealed, rolled copper cladding is generally preferred over electro-deposited copper for low-loss rf conductors, as microscopic defects in electro-deposited conductors may drastically reduce electron mean free paths and hence conductivity. After a few flex cycles, the annealed copper becomes work hardened and its yield strength increases substantially without significantly affecting conductivity. However, work-hardened copper still has only moderate yield strength, and stresses must be limited to about half of the yield stress to permit millions of flex cycles without failure. Hence, for 0.06 mm copper foil, the minimum flex radius for very long life is about 20 mm—or perhaps a flex radius cycle between 20 and 10 mm. Since the attenuation constant increases rapidly with decreasing frequency below the point at which the foil thickness is less than four times the rf skin depth (and the characteristic impedance also increases, but more slowly), the copper thickness usually must be greater than 0.04 mm, as low-loss performance below 50 MHz is often needed. Moreover, greater conductor thickness is desired even at UHF to handle the heating from 10 ms 50 A rf pulses; and increasing the thickness from 4 to 10 skin depths reduces attenuation constant by about 30% over a rather wide range of twinline impedances.

The laminate of this prior art is similar to that used in multi-conductor controlled-impedance ribbon cables commonly found in the computer and communications industries. Many electronic devices employ flexible multi-conductor cables consisting of parallel arrays of conductor strips on one or both sides of a polyimide substrate for power, logic, audio, and rf applications at low and moderate voltages. However, the low-voltage, high-loss fully shielded moderately flexible 50 Ω rf strip lines commonly used in communications, such as shown by Borokowski et al in U.S. Pat. No. 5,154,625, are completely unsatisfactory for the DAS NMR probe coil leads. The foil shielding makes this 'flexible' line rather rigid from the perspective of the DAS probe requirements, limits the propagation factor to a maximum of about 55%, and limits attenuation constant to 2 to 20 dB/m at 200 MHz, depending on substrate thickness. Moreover, the high-impedance separate strips of FIG. 1 are essentially unsatisfactory at high $B_0$, where low-inductance multinuclear rf coils must be used. The primary disadvantages of the prior art shown in FIG. 1 are its high and variable characteristic impedance (typically over 250 Ω) and moderate attenuation constant. While the ultra-low-loss flexible HV rf transmission lines disclosed herein, generically denoted as flexlines, should have applications outside of NMR probes (especially if scaled down for a lower voltage rating), the absence of an external rf shield will limit their utility to applications where external shielding is not needed or is already provided by other means.

SUMMARY OF THE INVENTION

A flexible, low-loss, low-capacitance, high-voltage, high-current, moderate-impedance, unshielded, balanced, rf-pulse transmission twinline is produced by etching parallel copper traces on opposite sides of a flexible substrate, spaced apart such that the distance between the conductors is greater than four times the substrate thickness and at least one of the conductors has a width greater than half of the separation between the conductors. A second, similar twinline may be etched on the same substrate beside the first twinline and paralleled at both ends with the first twinline to form a lower-impedance quadline such that alternate conductors in the quadline are on alternate sides of the substrate and have opposite current phases. Both surfaces may be coated with a thin, flexible dielectric to increase the voltage rating for a given conductor separation with minimal affect on propagation factor, attenuation constant, or flexibility. A second, similar quadline on a separate laminate displaced along the normal from the first may be paralleled with the first quadline forming a lower-impedance dual-quadline such that the two laminates have mean spacing comparable to or greater than the spacing between conductors within a twinline. The two quadlines are paralleled such that the phases in the conductors in one quadline are the same as the phases in the adjacent conductors in the adjacent quadline. The concepts may be extended in like manner for further reduction in characteristic impedance without sacrifice in propagation factor, attenuation constant, or flexibility.

DETAILED DESCRIPTION OF THE PREFERRED EMBODIMENT

The limitations to the prior art separate leads, as shown schematically in FIG. 1, arise from the requirement of a large space (10 to 20 mm) between conductor strips 1, 2 to accommodate movement during flexing, which, with practical conductor widths, results in characteristic impedance typically between 180 and 280 Ω, while the optimum for the multinuclear NMR coil is typically between 20 and 70 Ω and the optimum for fixed-frequency coils is often 60 to 260 Ω.

Figure 2:
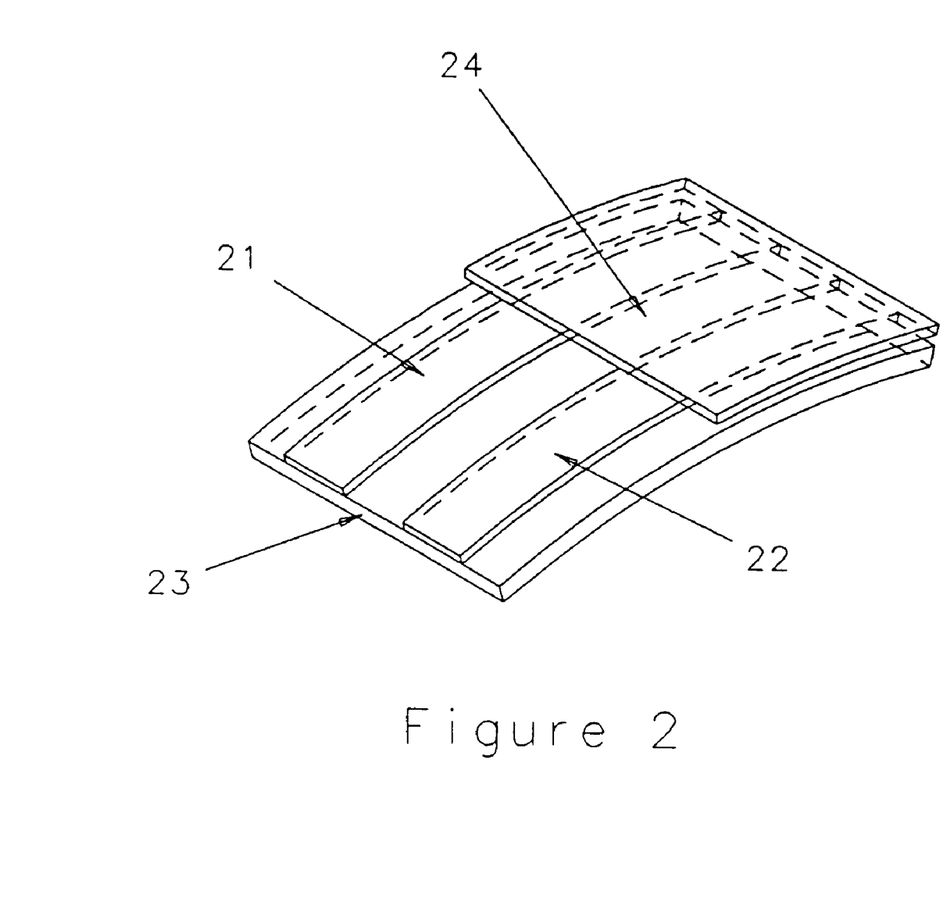
FIG. 2 illustrates the flexible, thin twinline.

FIG. 2 illustrates the simple twinline flexline—a thin, unshielded, low-capacitance, low-loss, substantially unsupported, flexible HV rf transmission line. The two copper strips 21, 22 must be spaced apart typically 2 to 8 mm on the flexible substrate 23 to handle the voltage and achieve low attenuation constant and high propagation factor (i.e., low capacitance, stemming from the fact that most of energy in the electric field is in the gas surrounding the twinline rather than in a solid dielectric). A low-loss polymeric conformal coating 24 (such as silicone, polystyrene, or polyimide) may be applied (for example, by precipitation) over the conductor strips to permit closer spacing and hence some reduction in impedance without voltage breakdown, but the attenuation constant increases because of current crowding along the inner edges. Since it is desirable to minimize the amount of polymeric materials so as to minimize NMR background signals, the coating thickness will typically be less than half the conductor thickness, but coating thickness up to the sum of the substrate and conductor thicknesses may be desired for low-impedance twinlines. Minimum attenuation constant for a given overall width of a thin, unshielded twinline is achieved when the conductor width is comparable to the lateral (inside) separation between conductors, at which point the (HF) characteristic impedance is about 160 Ω, although the attenuation constant increases rather slowly for impedances down to 80 Ω or up to 260 Ω. Normally, a larger ratio of conductor width to separation will be preferred such that the characteristic impedance is below 100 Ω for improved efficiency with multinuclear coils, but high-impedance twinlines (conductor widths as small as half the separation) would be preferred for some fixed-tuned coils.

It should be noted that characteristic impedances of the flexlines disclosed herein are much more frequency dependent throughout their intended range of use than is normally the case for rf transmission lines. The characteristic impedances indicated herein for flexlines are for HF conditions, where the skin depth is less than one fifth of the conductor thickness. The characteristic impedance may be 20% greater when the skin depth is half the conductor thickness, and the impedance may be doubled when the skin depth is twice the conductor thickness.

Compared to the prior art of FIG. 1, the thin twinline in FIG. 2 permits substantially lower and stable impedance, as the conductor separation is precisely controlled. While a slight reduction in loss is possible for a given conductor thickness of silver compared to copper, the conductor thickness may be much thicker for copper than for silver when millions of flexing cycles are required before failure. Even greater thickness is possible for a given flex radius if the conductor consists of copper-clad beryllium-copper sandwich. However, LF performance would be degraded because of the higher resistivity of the core conductor. For satisfactory lifetime, the substrate thickness must be less than four times the foil thickness—preferably much less for high-modulus substrates or low-temperature operation. For high propagation factor, the conductor separation must be greater than four times the substrate thickness—and preferably much greater for low attenuation constant and high voltage rating. The overall width of the thin twinline would normally be as great as space permits (often 20 mm), but it may be as small as twenty times the conductor thickness where VSWR is low.

Typically, the substrate 23 is either a polyimide about 0.05 mm thick or fiber-glass reinforced PTFE about 0.1 mm thick, but other low-loss dielectrics (such as glass or kevlar reinforced polycyanurate, polyetherimide, polyetheretherketone, or silicone) with flexural modulus as high as 10 GPa and elongation as low as 2% are also possible. For adequate flexibility, the conductor thickness must be less than 0.15 mm, and it is typically copper approximately 0.06 mm thick (2 oz copper per $ft^2$). (Note that for graphic clarity the drawings roughly illustrate a minimum ratio of width to thickness. Typical widths are much greater than shown relative to thicknesses.) Finally, it should be noted that two essential distinctions between FIG. 2 (without the conformal coating) and the unshielded thin twinline leads commonly used for decades in HR NMR probes (as may have been used, though not shown, in U.S. Pat. No. 4,398,149, for example) are flexibility and propagation factor. The prior art HR coil twinline leads are rigidly attached to the quartz or ceramic tube on which the rf coil is also mounted. Obviously, this makes the twinline rigid, and it also severely degrades propagation factor, as the coilform thickness is normally comparable to the separation between the twinline conductors and/or a shield is present with deleterious effect on propagation factor. The instant invention is rigidly supported only near the ends and in a way that minimizes stress concentrations during flexing.

In an exemplary embodiment, the parallel foil conductors may thus have overall width greater than twenty times the thickness of the conductors. At least one of the conductors has thickness greater than 0.025 mm but less than 0.15 mm. Copper thickness as small as 0.025 mm may be sufficient for applications above 150 Mhz. The substrate may have a thickness less than one-fourth of the separation distance between conductors, and may have a thickness less than four times the thickness of at least one of the conductors.

Figure 3:
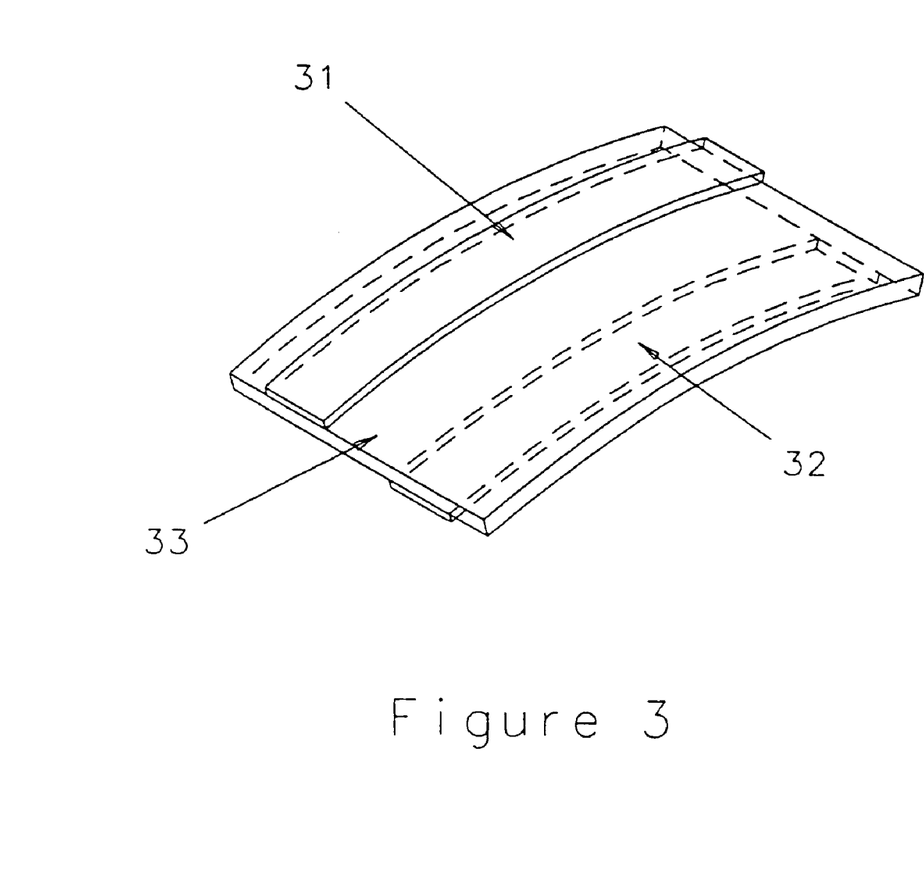
FIG. 3 discloses the flexible, thin, HV twinline.

FIG. 3 illustrates an improvement in the flexible, thin, HV twinline. By placing the adjacent conductors 31, 32 on opposite sides of the substrate 33 voltage handling is increased and/or impedance may be reduced without the use of additional polymeric coatings. Conformal polymeric coatings may still be applied, to permit further reduction in conductor spacing with negligible increase in capacitance or backgrounds, but now there is little benefit from covering more than the inside conductor edges, where electric fields are highest. Flexibility is generally not adversely affected if the separation between conductors is greater than six to ten times the substrate thickness, depending on its modulus. Spacing is typically 2 to 3 mm, but spacing as small as 0.4 mm is sometimes adequate where VSWR and voltage are not too high.

Figure 4A:
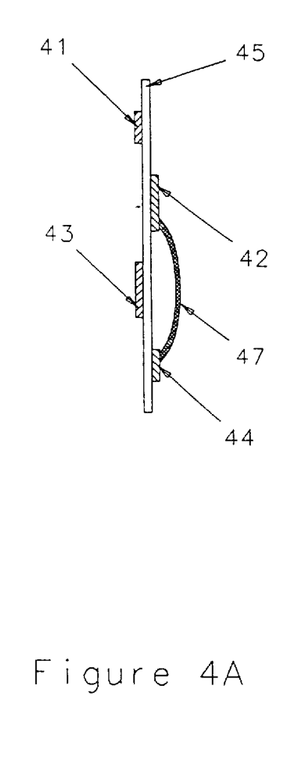
FIGS. 4a and 4b illustrate in cross section and plan view the flexible HV quadline.
Figure 4B:
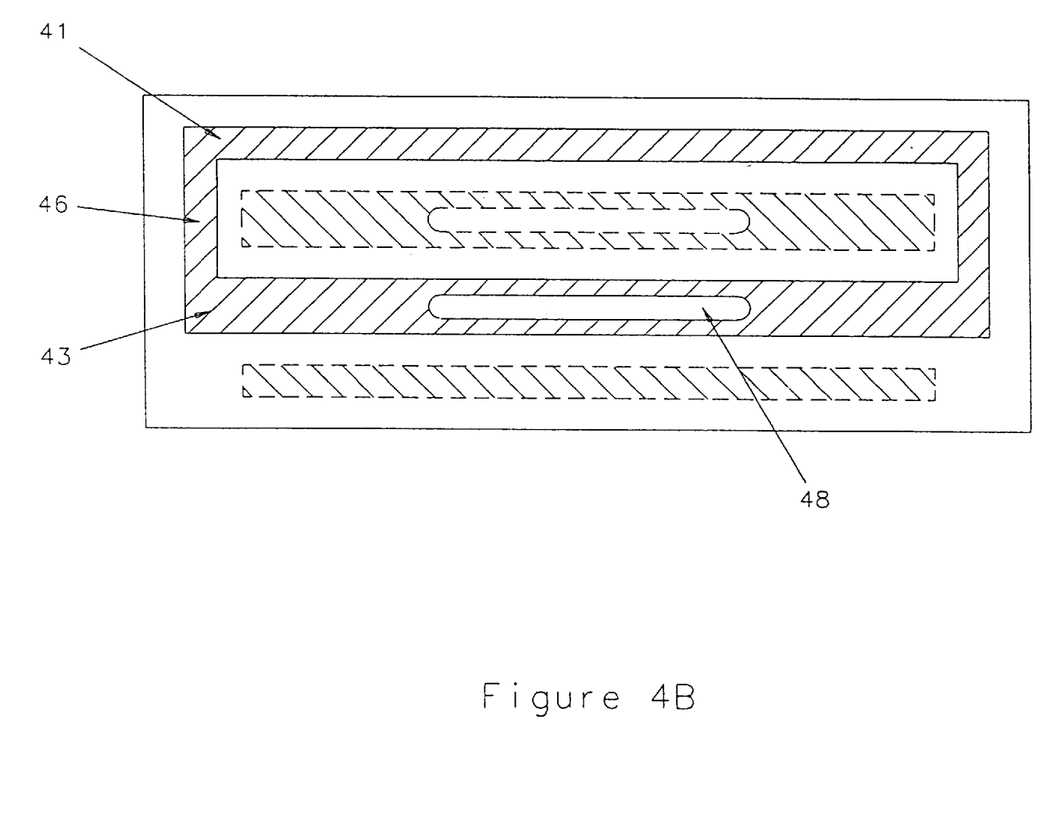

FIGS. 4a and 4b illustrate in cross section and plan view an effective method of reducing impedance in a flexible transmission line with negligible sacrifice in attenuation constant, propagation factor, or flexibility and will be denoted the thin quadline. Conductors 41, 42, 43, 44 have alternate phase (in both current and voltage) and preferably are laminated to alternate sides of the substrate 45 as shown. Also, the outer conductors 41, 44 preferably are narrower than the inner conductors. A paralleling trace 46 may be etched between one pair of conductors at each end if the other pair stops short, but an air-spaced (or foam-spaced) foil jumper 47 is required for the other parallel connection, as the substrate is normally too thin to withstand the potential difference between overlapping traces on opposite sides of the substrate. Moreover, an overlap would degrade propagation factor and perhaps attenuation constant unacceptably. Similar parallel connections are required at the other end.

Minimum attenuation constant for a given overall width of the quadline is obtained when the outer conductors 41, 44 have width comparable to the separation between adjacent conductors and the inner conductors 42, 43 have width about twice this amount, at which point the HF characteristic impedance is about 80 Ω. Flexibility may be enhanced with little effect on attenuation constant or impedance by etching elongated eyelets 48 along the center of the inner conductors. Materials considerations for the thin HV quadline are the same as for the thin HV twinline of FIG. 3; and again, a characteristic impedance below that required for minimum attenuation constant would normally be chosen to improve multinuclear coil efficiency. Where lateral space permits, the paralleling may be extended in similar fashion to six parallel conductors on a single substrate (denoted a hexline) for lower impedance without sacrifice in propagation factor, attenuation constant, or flexibility.

For 2n spaced-apart parallel foil conductors on a flexible dielectric substrate, where n is an integer greater than one, the optimum overall width is generally as large as practical and at least greater than 20n times the thickness of the conductors.

Figure 5A:
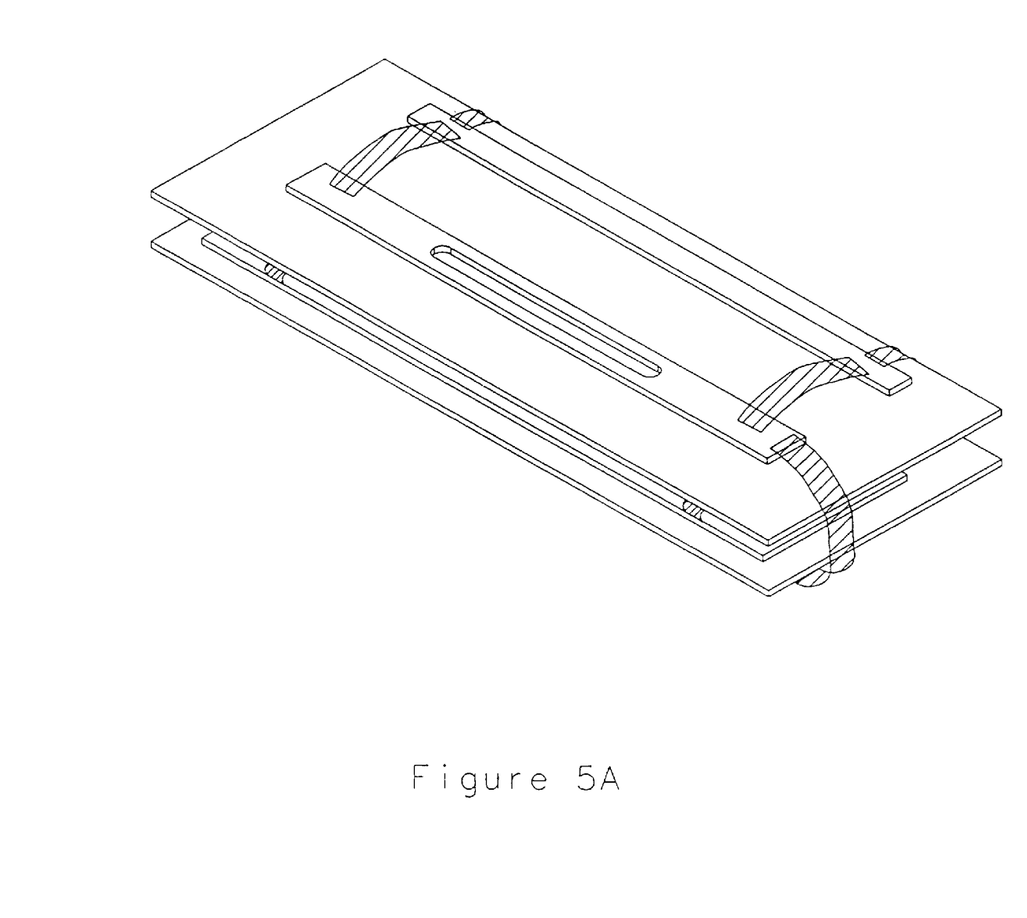
FIGS. 5a and 5b illustrate the flexible, thin, HV dual-quadline.
Figure 5B:
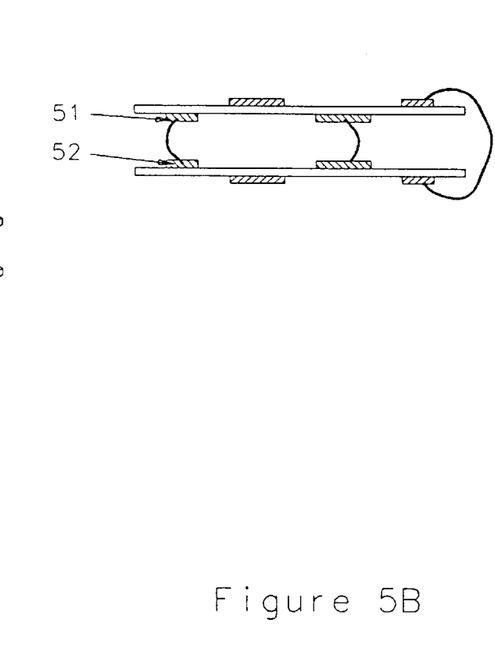

Two similar thin HV low-capacitance rf transmission lines or flexlines, one displaced in the normal direction from the other, may be connected in parallel for a further reduction in impedance by a factor of two with little sacrifice in propagation factor, flexibility, or attenuation constant, especially at the low end of the intended frequency range of operation. FIGS. 5a and 5b illustrates two quadlines in parallel. To prevent high-voltage failure and to minimize change in impedance as the normal spacing changes during flexing, adjacent conductors 51, 52 must have the same phase (most of the parralleling jumpers are not shown). Hence, the etch patterns on the two thin transmission lines are reflections of each other. The normal separation is typically greater than the lateral spacing between adjacent conductors in each flexline, but it will vary, and they may touch at several points during flexing, causing some increase in impedance and attenuation. When the normal separation is comparable to the lateral separation, the coupling increases the effective parallel impedance and attenuation constant by about 20% compared to widely spaced flexlines.

In an exemplary embodiment, the flexline may have a paralleled characteristic impedance in ohms greater than 100/n but less than 240/n. For n pairs of parallel twinlines the optimum impedance is usually found to lie near the middle of the range between 100/n and 240/n.

A third flexline may be stacked in like manner along the normal to the plane for further reduction in characteristic impedance with little loss in propagation factor, but the low attenuation constant cannot be maintained, as most of the current on the inner flexline would be concentrated on the conductor edges.

A thin strip of dielectric foam (such as foamed PTFE) may be placed between the flex lines to maintain a minimum spacing as long as it is not bonded to both flex lines, but it still may limit flexibility, especially at low temperatures. Of course, there are many situations in NMR probes where the high propagation factor, low loss, controlled impedance, high voltage, and low backgrounds afforded by a flexline make it the preferred rf transmission line even when flexibility is not required. In some of these situations and especially in applications other than NMR probes an external rf shield spaced from the flexlines by foam insulation thick enough to maintain a high propagation factor may also be desired.

Figure 6:
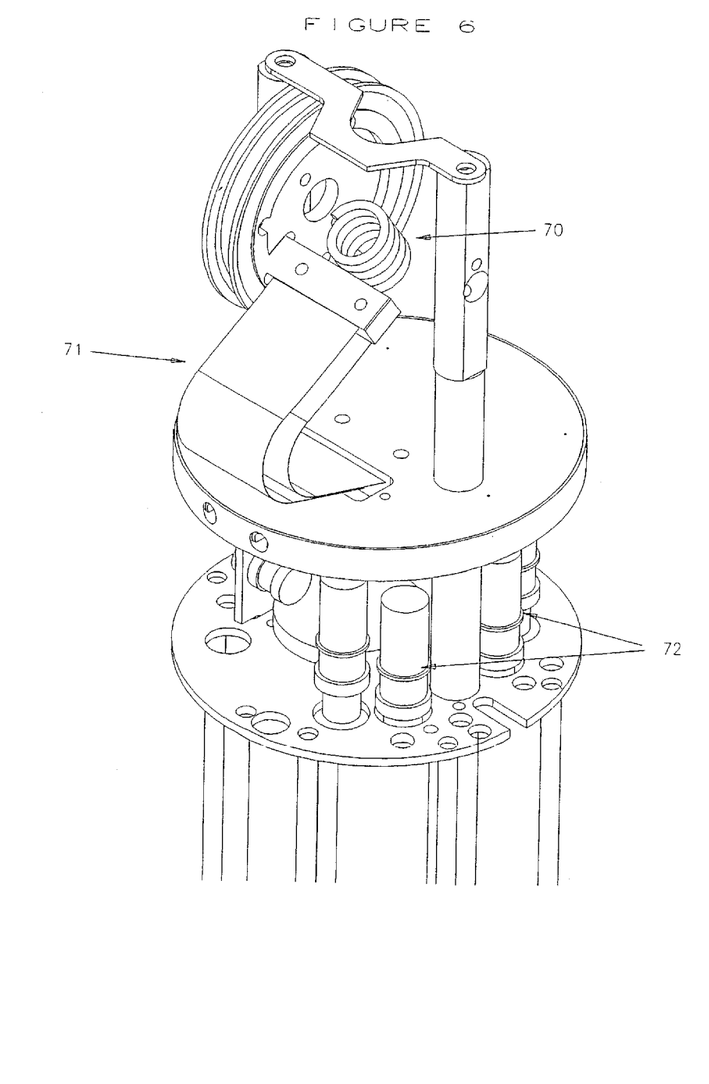
FIG. 6 is a perspective view of an NMR probe.

FIG. 6 is a simplified perspective view of an NMR probe 71 showing use of the flexline, showing an RF coil 70, tuning capacitors 73, and flexline 72. Much of the NMR probe 71 is omitted for clarity in FIG. 6.

Many additional HV flexline arrangements are possible. All such modifications and changes are intended to be included within the scope of the following claims.

FLEXIBLE FOILS LEAD ON KAPTON

Kapton Quad-Lines, shorted at one end and tuned by fixed capacitor at open end Tested at 3.3 kV at 140 MHz. No evidence of failure of Quad Line

| 2-mil kapton, 2-oz double clad copper: 2.5/2.5/5/5/2.5/2.5 | | | | | | | | |
|---|---|---|---|---|---|---|---|---|
| Lgh mm | F MHz | $C_1$ pF | Q | $C_S$ pF | $L_T$ nH | $L_L$ nH | nH/mm | $Z_0$ Ω |
| 70.00 | 24.00 | 1100.00 | 45.00 | | 40.00 | ~9 | 0.44 | 97.00 |
| 70.00 | 199.00 | 20.00 | 160.00 | 0.80 | 30.00 | ~5 | 0.35 | 77.00 |
| 70.00 | 391.00 | 5.00 | 195.00 | 0.80 | 28.00 | ~5 | 0.33 | 73.00 |
| 66.00 | 216.00 | 16.00 | | | 28.00 | ~6 | | |
| Dual-66 | 195.00 | 2 × 16 | 117.00 | 1.50 | 21.00 | ~3 | 0.27 | 60.00 |

The inductance increases at LF where the skin depth becomes comparable to the conductor thickness because of substantial flux penetration of the conductor strips. This also causes the Q to drop off more quickly. The dual-quad strips were spaced 2.2 mm apart, at which point the effective inductance of the separate coupled lines had increased 20%. The above data do not show a decrease in effective series resistance from the use of dual parallel quad lines at 200 MHz, although inductance is reduced substantially. However, Q includes capacitor losses, and error bars are at least 20%.

| Thin Twinline, Air dielectric, ~20 mm OA width, 100 mm lgh | | | | | | | | | |
|---|---|---|---|---|---|---|---|---|---|
| Copper Width, mm | Cu Thick. mm | O.A. wdth mm | F MHz | $C_1$ pF | Q | $C_S$ pF | $L_T$ nH | nH/mm | $Z_0$ Ω |
| 2.50 | 0.08 | 19.90 | 25.40 | 270.00 | 164.00 | 0.80 | 140.00 | 1.40 | 310.00 |
| 2.50 | 0.03 | 19.70 | 68.20 | 39.00 | 222.00 | | | | |
| 2.50 | 0.08 | 19.90 | 68.60 | 39.00 | 269.00 | | | | |
| 2.50 | 0.08 | 19.90 | 217.00 | 3.30 | 385.00 | 0.70 | 130.00 | 1.30 | 287.00 |
| 4.90 | 0.08 | 20.00 | 29.20 | 270.00 | 224.00 | 1.10 | 110.00 | 1.10 | 243.00 |
| 4.85 | 0.03 | 19.90 | 79.20 | 39.00 | 275.00 | | | | |
| 4.90 | 0.08 | 20.00 | 81.00 | 39.00 | 338.00 | 1.10 | 92.00 | 0.92 | 203.00 |
| 4.85 | 0.12 | 20.00 | 80.00 | 39.00 | 354.00 | | | | |
| 4.90 | 0.08 | 20.00 | 253.00 | 3.30 | 448.00 | 1.00 | 87.00 | 0.87 | 192.00 |
| 7.00 | 0.08 | 20.00 | 34.90 | 270.00 | 214.00 | 1.50 | 76.00 | 0.76 | 168.00 |
| 7.20 | 0.03 | 20.00 | 90.10 | 39.00 | 247.00 | | | | |
| 7.00 | 0.08 | 20.00 | 97.70 | 39.00 | 305.00 | 1.50 | 63.00 | 0.63 | 140.00 |
| 7.00 | 0.08 | 20.00 | 299.10 | 3.30 | 437.00 | 1.50 | 60.00 | 0.60 | 132.00 |
| 8.00 | 0.08 | 20.00 | 79.00 | 68.00 | 270.00 | | | | |

I claim:
1. An NMR probe for use in an external field $B_0$, said probe comprising:
   an rf coil connected to tuning capacitors by means of a substantially unsupported flexible laminate thin twinline,
   said twinline further characterized as comprising two spaced-apart adjacent parallel foil conductors on a flexible dielectric substrate and having overall width greater than twenty times the thickness of said conductors,
   at least one of said conductors further characterized as having width greater than half the separation distance between said conductors and having thickness greater than 0.025 mm but less than 0.15 mm, said substrate further characterized as having thickness less than one-fourth said separation distance and less than four times the thickness of said foil conductor, said substrate further characterized as having flexural modulus less than 10 GPa and elongation greater than 2%.

2. The NMR probe as in 1 wherein said conductors are further characterized as being of copper and said substrate is further characterized as substantially comprising one or more of the following materials: polyimide, PTFE, polyetherimide, polyetheretherketone, silicone, kevlar fibers, glass fibers, adhesive.

3. The NMR probe as in 1 wherein said rf coil is affixed to a cylindrical ceramic coilform capable of reorientation with respect to said $B_0$.

4. The NMR probe as in 1 wherein said thin twinline is further characterized as being substantially surrounded by gas or foamed polymer for a distance greater than half said separation distance.

5. The NMR probe as in 1 wherein said adjacent conductors are on opposite sides of said substrate.

6. The NMR probe as in 1 wherein said conductors are further characterized as having their edges coated with a low-loss polymeric dielectric of thickness less than the sum of the thickness of said conductors and said substrate.

7. The NMR probe as in 1 wherein at least one of said conductors includes an elongated eyelet.

8. The NMR probe as in 1 further characterized as containing a plurality of said twinlines with electrically parallel connections at both ends.

9. The NMR probe as in 8 wherein the second of two parallel twinlines is displaced from the first in a direction normal to its plane and said twinlines are paralleled such that conductors in equal lateral locations on said first and second twinlines have the same voltage phase.

10. An NMR probe for use in an external field $B_0$, said probe comprising:

an rf coil connected to tuning capacitors by means of a substantially unsupported laminate HV flexline, said flexline further characterized as comprising 2n spaced-apart parallel foil conductors on a flexible dielectric substrate, where n is an integer greater than one, and having overall width greater than the product of 20n and the thickness of said conductors, at least one of said conductors further characterized as having width greater than half the separation distance between two adjacent conductors and having thickness greater than 0.025 mm but less than 0.15 mm, said substrate further characterized as having thickness less than one-fourth said separation distance and less than four times the thickness of said foil conductor, said substrate further characterized as having flexural modulus less than 10 GPa and elongation greater than 2%.

11. The NMR probe as in 10 wherein said conductors are further characterized as being of copper and said substrate is further characterized as substantially comprising one or more of the following materials: polyimide, PTFE, polyetherimide, polyetheretherketone, silicone, kevlar fibers, glass fibers, adhesive.

12. The NMR probe as in 10 wherein said rf coil is affixed to a cylindrical ceramic coilform capable of reorientation with respect to said $B_0$.

13. The NMR probe as in 10 wherein said flexline is further characterized as being substantially surrounded by gas for a distance greater than half said separation distance.

14. The NMR probe as in 10 wherein said adjacent conductors are on opposite sides of said substrate.

15. The NMR probe as in 10 wherein the width of the outermost conductors is comparable to or greater than the separation between said adjacent conductors and the width of the innermost conductors is approximately twice the width of the outermost conductors.

16. The NMR probe as in 10 wherein one of said innermost conductors includes an elongated eyelet.

17. The NMR probe as in 10 wherein said conductors are further characterized as having their edges coated with a low-loss polymeric dielectric of thickness less than the sum of the thickness of said conductors and said substrate.

18. The NMR probe as in 10 further characterized as containing a plurality of said flexlines with electrically parallel connections at both ends.

19. The NMR probe as in 18 wherein the second of two parallel flexlines is displaced from the first in a direction normal to its plane and said flexlines are paralleled such that conductors in equal lateral locations on said first and second flexlines have the same voltage phase.

20. A laminate flexline for balanced rf power transmission, said flexline further characterized as comprising 2n spaced-apart parallel foil conductors on a flexible dielectric substrate, where n is a positive integer, and having overall width greater than the product of 20n and the thickness of said conductors, at least one of said conductors further characterized as having width greater than half the separation distance between two adjacent conductors and having thickness greater than 0.025 mm but less than 0.15 mm, said substrate further characterized as having thickness less than one-fourth said separation distance and less than four times the thickness of said foil conductor, said substrate further characterized as having flexural modulus less than 10 GPa, dielectric constant less than 4.0, and elongation greater than 2%, said conductors further characterized as being of copper and said substrate further characterized as substantially comprising one or more of the following materials: polyimide, PTFE, polyetherimide, polyetheretherketone, silicone, kevlar fibers, glass fibers, adhesive;

said adjacent conductors further characterized as disposed on opposite sides of said substrate, said flexline further characterized as having propagation factor greater than 80% and having paralleled characteristic impedance in ohms greater than 100/n but less than 240/n.

21. The flexline as in 20 wherein said conductors are further characterized as having their edges coated with a low-loss polymeric dielectric of thickness less than the sum of the thickness of said conductors and said substrate.

22. The flexline as in 20 wherein one of said conductors includes an elongated eyelet.

23. The flexline as in 20 having propagation velocity factor greater than 80%.

24. The flexline as in 20 further characterized as being unshielded.

25. The flexline as in 20 further characterized as including external foam insulation and rf shielding.

* * * * *